US010600456B2

(12) United States Patent
Sforzin et al.

(10) Patent No.: US 10,600,456 B2
(45) Date of Patent: *Mar. 24, 2020

(54) PROGRAM OPERATIONS IN MEMORY

(71) Applicant: Micron Technology, Inc., Boise, ID (US)

(72) Inventors: Marco Sforzin, Cernusco sul Naviglio (IT); Paolo Amato, Treviglio (IT); Innocenzo Tortorelli, Cernusco sul Naviglio (IT); Marco Dallabora, Melegnano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/215,693

(22) Filed: Dec. 11, 2018

(65) Prior Publication Data
US 2019/0122709 A1 Apr. 25, 2019

Related U.S. Application Data

(63) Continuation of application No. 15/659,728, filed on Jul. 26, 2017, now Pat. No. 10,157,650.

(51) Int. Cl.
G11C 11/00 (2006.01)
G11C 7/10 (2006.01)
G11C 13/00 (2006.01)

(52) U.S. Cl.
CPC ............ G11C 7/1096 (2013.01); G11C 13/00 (2013.01); G11C 13/0069 (2013.01); G11C 13/0061 (2013.01); G11C 2013/0076 (2013.01); G11C 2213/71 (2013.01); G11C 2213/72 (2013.01); G11C 2213/76 (2013.01); G11C 2213/79 (2013.01)

(58) Field of Classification Search
CPC ... G11C 7/1096; G11C 13/00; G11C 13/0069; G11C 13/0061; G11C 2213/71; G11C 2213/72; G11C 2213/76; G11C 2213/79
USPC .................................................. 365/51, 148
See application file for complete search history.

(56) References Cited

U.S. PATENT DOCUMENTS

| 8,611,155 | B2 | 12/2013 | Kim et al. |
| 9,612,958 | B1 | 4/2017 | Asnaashari |
| 10,157,650 | B1* | 12/2018 | Sforzin .................. G11C 13/00 |
| 2004/0022085 | A1* | 2/2004 | Parkinson ........... G11C 11/5678 365/113 |
| 2014/0226398 | A1 | 8/2014 | Desireddi et al. |
| 2014/0351487 | A1 | 11/2014 | Kim et al. |

(Continued)

OTHER PUBLICATIONS

International Search Report and Written Opinion dated Oct. 16, 2018 for PCT Application No. PCT/US2018/043012 Filed Jul. 20, 2018, 14 pages.

Primary Examiner — Huan Hoang
(74) Attorney, Agent, or Firm — Brooks, Cameron & Huebsch, PLLC

(57) ABSTRACT

The present disclosure includes apparatuses and methods related to program operations in memory. An example apparatus can perform a program operation on an array of memory cells by applying a first program signal to a first portion of the array of memory cells that are to remain in a first state in response to the program operation, wherein the first program signal programs memory cells to a second state and then to the first state.

19 Claims, 4 Drawing Sheets

(56) References Cited

U.S. PATENT DOCUMENTS

| | | |
|---|---|---|
| 2014/0376310 A1 | 12/2014 | Kim et al. |
| 2015/0023094 A1 | 1/2015 | Lam et al. |
| 2015/0078087 A1 | 3/2015 | Shim et al. |
| 2015/0255152 A1 | 9/2015 | Bedeschi et al. |
| 2015/0287459 A1 | 10/2015 | Navon |
| 2015/0325293 A1 | 11/2015 | Bedeschi |
| 2016/0098216 A1 | 4/2016 | Huang et al. |
| 2016/0189774 A1 | 6/2016 | Xie et al. |
| 2016/0336048 A1 | 11/2016 | Taub et al. |
| 2017/0345503 A1 | 11/2017 | Kim et al. |

* cited by examiner

Fig. 4A

| STATE | SIGNAL |
|---|---|
| 1 → 1 | R-SET |
| 0 → 0 | RESET |
| 1 → 0 | RESET |
| 0 → 1 | R-SET |

Fig. 4B

| STATE | SIGNAL |
|---|---|
| 1 → 1 | R-SET |
| 0 → 0 | RESET |
| 1 → 0 | RESET |
| 0 → 1 | SET |

Fig. 4C

| STATE | SIGNAL |
|---|---|
| 1 → 1 | R-SET |
| 0 → 0 |  |
| 1 → 0 | RESET |
| 0 → 1 | SET |

Fig. 4D

| STATE | SIGNAL |
|---|---|
| 1 → 1 | R-SET |
| 0 → 0 | S-RESET |
| 1 → 0 | S-RESET |
| 0 → 1 | R-SET |

PROGRAM OPERATIONS IN MEMORY

PRIORITY INFORMATION

This Application is a Continuation of U.S. application Ser. No. 15/659,728, filed Jul. 26, 2017, the contents of which are incorporated herein by reference.

TECHNICAL FIELD

The present disclosure relates generally to memory devices, and more particularly, to apparatuses and methods for program operations in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory system used in computing devices. Memory systems can include volatile, such as DRAM, for example, and/or non-volatile memory, such as Flash memory or RRAM, for example.

BRIEF DESCRIPTION OF THE DRAWINGS

FIG. 4A is a table illustrating state and signal of a number of portions of a program operation in accordance with a number of embodiments of the present disclosure.

FIG. 4B is a table illustrating state and signal of a number of portions of a program operation in accordance with a number of embodiments of the present disclosure.

FIG. 4C is a table illustrating state and signal of a number of portions of a program operation in accordance with a number of embodiments of the present disclosure.

FIG. 4D is a table illustrating state and signal of a number of portions of a program operation in accordance with a number of embodiments of the present disclosure.

DETAILED DESCRIPTION

Figure 1A:
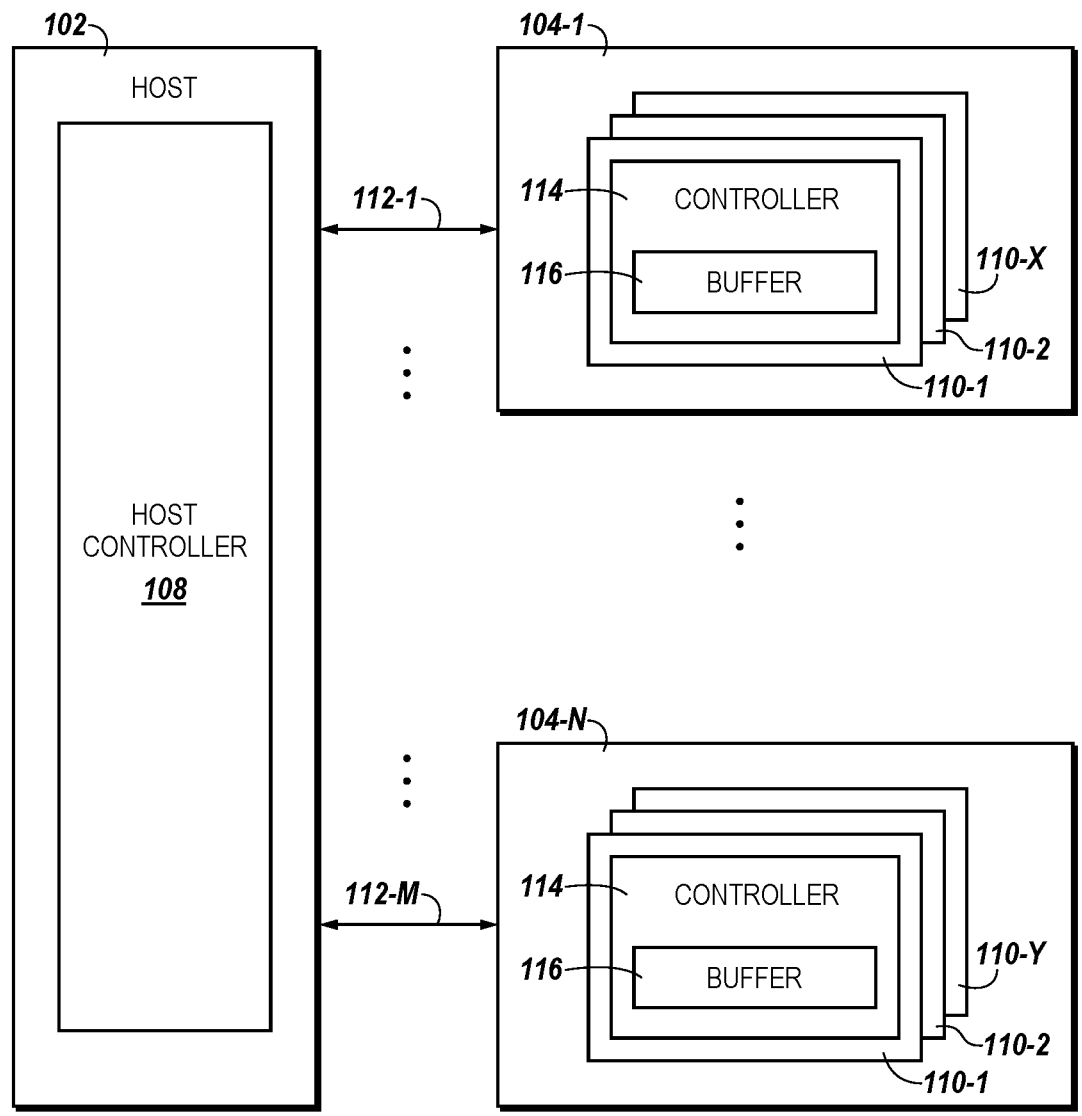
FIG. 1A is a block diagram of an apparatus in the form of a computing system including a memory system in accordance with a number of embodiments of the present disclosure.

The present disclosure includes apparatuses and methods related to program operations in memory. An example apparatus can perform a program operation on an array of memory cells by applying a first program signal to a first portion of the array of memory cells that are to remain in a first state in response to the program operation, wherein the first program signal programs memory cells to a second state and then to the first state.

In one or more embodiments of the present disclosure, a controller can be configured to perform a program operation on an array of memory cells by applying an r-set signal and/or an s-reset signal to the array of memory cells. The r-set signal, for example, can include a first portion and a second portion. The first portion can include a signal to program memory cells to a reset state. The second portion can include a signal to program memory cells to a set state. The s-reset signal can include first portion and a second portion, where the first portion can program a memory cell to a set state and the second portion can program a memory cell to a reset state.

In one or more embodiments of the present disclosure, the controller can be configured to perform the program operation blind, for example, wherein a pre-read operation is not performed and programming signals are applied to each memory cell based on the desired state for the memory cells. In a number of embodiments, a program signal can be applied to each memory cell of the array of memory cells.

The controller can also be configured to perform a pre-read operation on the memory cells of the array of memory cells before performing the program operation. The pre-read can determine which of the memory cells of the array of memory cells will be programmed during the program operation.

In one or more embodiments of the present disclosure, the controller is configured to apply the first program signal, for example an r-set signal, to a first portion of the array of memory cells that are to change from the second state to the first state. The controller can also be configured to apply a second program signal, for example a set signal, to a second portion of the array of memory cells that are to change from the second state to the first state. In one or more embodiments, the controller is configured to apply a third program signal, for example a reset signal, to a third portion of the array of memory cells that are to change from the first state to the second state. The controller can also be configured to apply a third program signal, for example a reset signal, to a fourth portion of the array of memory cells that are to remain in the second state.

In one or more embodiments of the present disclosure, the first state is a set state and the second state is a reset state. A set state can be a state corresponding to a logic state of 1 and a reset state can be a state corresponding to a logic state of 0, although embodiments are not limited to these logic state assignments. Also, in one or more embodiments, the first state can be a reset state and the second state can be a set state.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "M","N", "S", "T", "X", "Y", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include one or more memory devices, such as memory devices 110-1, . . . , 110-X, 110-Y. Memory devices 110-1, . . . , 110-X, 110-Y can include volatile memory and/or non-volatile memory. In a number of embodiments, memory systems 104-1, . . . , 104-N can include a multi-chip device. A multi-chip device can include a number of different memory types. For example, a memory system can include a number of chips having non-volatile or volatile memory on any type of a module. In FIG. 1A, memory system 104-1 is coupled to the host 102 via channels 112-1 can include memory devices 110-1, . . . , 110-X. For example, memory device 110-1 can be a non-volatile cross-point array memory device and 110-X can be a NAND flash memory device. In this example, each memory device 110-1, . . . , 110-X, 110-Y includes a controller 114. Controller 114 can receive commands from host 102 and control execution of the commands on a memory device. The host 102 can send commands to the memory devices 110-1, . . . , 110-X, 110-Y. For example, the host can communicate on the same channel (e.g., channel 112-1) with a non-volatile cross-point array memory device and a NAND flash memory device that are both on the same memory system.

As illustrated in FIG. 1A, a host 102 can be coupled to the memory systems 104-1 . . . 104-N. In a number of embodiments, each memory system 104-1 . . . 104-N can be coupled to host 102 via a channel. In FIG. 1A, memory system 104-1 is coupled to host 102 via channel 112-1 and memory system 104-N is coupled to host 102 via channel 112-N. Host 102 can be a laptop computer, personal computers, digital camera, digital recording and playback device, mobile telephone, PDA, memory card reader, interface hub, among other host systems, and can include a memory access device (e.g., a processor). One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the memory devices 110-1, . . . , 110-X, 110-Y via channels 112-1 . . . 112-N. The host controller 108 can communicate with the memory devices 110-1, . . . , 110-X, 110-Y and/or the controller 114 on each of the memory devices 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between host 102 and memory devices 110-1, . . . , 110-X, 110-Y on a number of buses, such as a data bus and/or an address bus, for example, via channels 112-1 . . . 112-N.

The host controller 108 and/or controller 114 on a memory device can include control circuitry (e.g., hardware, firmware, and/or software). In one or more embodiments, the host controller 108 and/or controller 114 can be an application specific integrated circuit (ASIC) coupled to a printed circuit board including a physical interface. Also, each memory device 110-1, . . . , 110-X, 110-Y can include buffer 116 of volatile and/or non-volatile memory. Buffer 116 can be used to buffer data that is used during execution of read commands and/or write commands. The buffer 116 can be configured to store signals, address signals (e.g., read and/or write commands), and/or data (e.g., write data). The buffer can temporarily store signals and/or data while commands are executed.

The memory devices 110-1, . . . , 110-X, 110-Y can provide main memory for the memory system or could be used as additional memory or storage throughout the memory system. Each memory device 110-1, . . . , 110-X, 110-Y can include one or more arrays of memory cells (e.g., non-volatile memory cells). The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the memory devices 110-1, . . . , 110-X, 110-Y. It will be appreciated by those skilled in the art that the number of address input connections can depend on the density and architecture of the memory devices 110-1, . . . , 110-X, 110-Y.

Figure 1B:
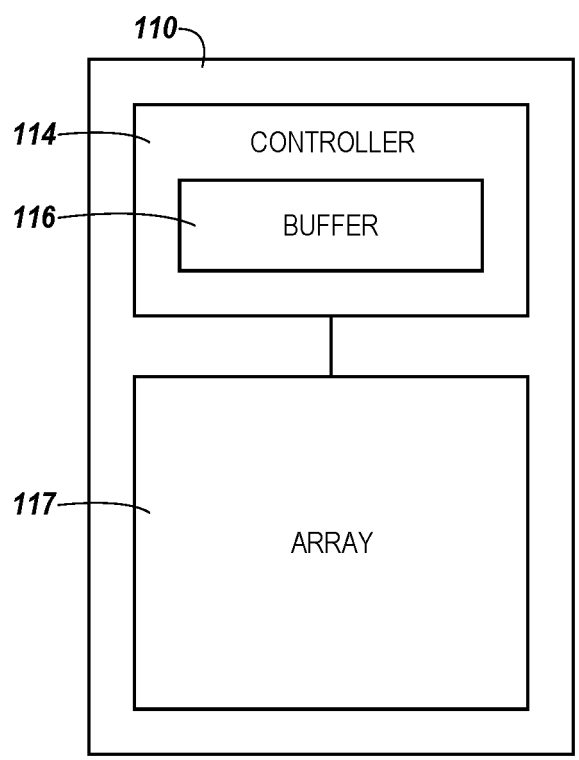
FIG. 1B is a block diagram of an apparatus in the form of a memory device in accordance with a number of embodiments of the present disclosure.

FIG. 1B is a block diagram of an apparatus in the form of a memory device in accordance with a number of embodiments of the present disclosure. In FIG. 1B, memory device 110 can include a controller 114 and an array of memory cells 117. The controller 114 can include a buffer. The array 117 can include one or more arrays of memory cells. The one or more arrays can be non-volatile memory arrays and/or volatile memory arrays.

In one or more embodiments, the controller 114 can be configured to perform a program operation on the array 117. The controller 114 can apply a first program signal to a first portion of the array 117 that are to remain in a first state in response to the program operation, wherein the first program signal programs memory cells of the array 117 to a second state and then to the first state.

Figure 2:
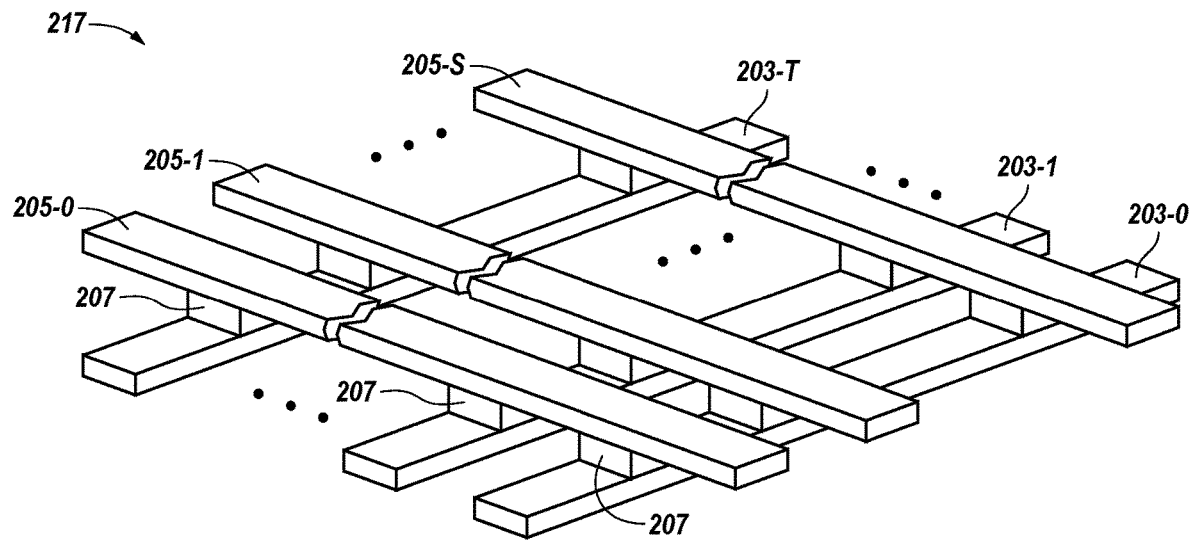
FIG. 2 is a block diagram of a portion of an array of memory cells in accordance with a number of embodiments of the present disclosure.

FIG. 2 is a block diagram of a portion of an array 217 of memory cells 207 in accordance with a number of embodiments of the present disclosure. The array 217 can be a two terminal cross-point array having memory cells 207 located at the intersections of a first plurality of conductive lines (e.g., access lines) 203-0, 203-1, . . . , 203-T, which may be referred to herein as word lines, and a second plurality of conductive lines (e.g., data/sense lines, 205-0, 205-1, . . . , 205-S) which may be referred to herein as bit lines. The designators T and S can have various values. Embodiments are not limited to a particular number of word lines and/or bit lines. As illustrated, the word lines 203-0, 203-1, . . . , 203-T are parallel to each other and are orthogonal to the bit lines 205-0, 205-1, . . . , 205-S, which are substantially parallel to each other; however, embodiments are not so limited. The conductive lines can include conductive material (e.g., a metal material). Examples of the conductive material include, but are not limited to, tungsten, copper, titanium, aluminum, and/or combinations thereof, among other conductive materials.

Each memory cell 207 may include a memory element (e.g., a resistive memory element) coupled in series with a select device (e.g., an access device) in accordance with a number of embodiments described herein. The memory element and the select device are discussed further herein.

The select devices can be operated (e.g., turned on/off) to select/deselect the memory element in order to perform operations such as data programming (e.g., writing, and/or data sensing (e.g., reading operations)). The select device can be a diode, a bipolar junction transistor, a MOS transistor, and/or an Ovonic threshold switch, among other devices. In operation, appropriate voltage and/or current signals (e.g., pulses) can be applied to the bit lines and word lines in order to program data to and/or read data from the memory cells 207. The memory cells 207 can be programmed to a set state (e.g., low resistance) or a reset state (e.g., high resistance). As an example, the data stored by a memory cell 207 of array 217 can be determined by turning on a select device and sensing a current through the memory element. The current sensed on the bit line corresponding to the memory cell 207 being read corresponds to a resistance level of the memory element (e.g., a resistance level of a resistance variable material) which in turn may correspond to a particular data state (e.g., a binary value). The array 217 can have an architecture other than that illustrated in FIG. 2, as will be understood by one of ordinary skill in the art.

The array 217 can be a two dimensional array. For example, the memory cells 207 of the array 217 can be arranged between the access lines, 203-0, 203-1, . . . , 203-T and the data/sense lines, 205-0, 205-1, . . . , 205-S in a single level. The array 217 can be a three dimensional array. For example, the memory cells of the array can be arranged in multiple levels, where each of the multiple levels has memory cells organized in a cross point architecture. For three dimensional array embodiments of the present disclosure, a vertical string of memory cells can be coupled to a data line and a plurality of access lines coupled to the vertical string of memory cells, for instance.

The access lines 203-0, 203-1, . . . , 203-T and the data/sense lines 205-0, 205-1, . . . , 205-S can be coupled to decoding circuits formed in a substrate material (e.g., formed adjacent to or for example below) the array 217 and used to interpret various signals (e.g., voltages and/or currents) on the access lines and/or the data/sense lines. As an example, the decoding circuits may include row decoding circuits for decoding signals on the access lines, and column decoding circuits for decoding signals on the data/sense lines.

As used in the present disclosure, the term substrate material can include silicon-on-insulator (SOI) or silicon-on-sapphire (SOS) technology, doped and undoped semiconductors, epitaxial layers of silicon supported by a base semiconductor foundation, conventional metal oxide semiconductors (CMOS) (e.g., a CMOS front end with a metal backend) and/or other semiconductor structures and technologies. Various elements (e.g., transistors, and/or circuitry), such as decode circuitry for instance, associated with operating the array 217 can be formed in/on the substrate material such as via process steps to form regions or junctions in the base semiconductor structure or foundation.

The memory cells 207 can be formed using various processing techniques such as atomic material deposition (ALD), physical vapor deposition (PVD), chemical vapor deposition (CVD), supercritical fluid deposition (SFD), molecular beam expitaxy (MBE), patterning, etching, filling, chemical mechanical planarization (CMP), combinations thereof, and/or other suitable processes. In accordance with a number of embodiments of the present disclosure, materials may be grown in situ.

Figure 3:
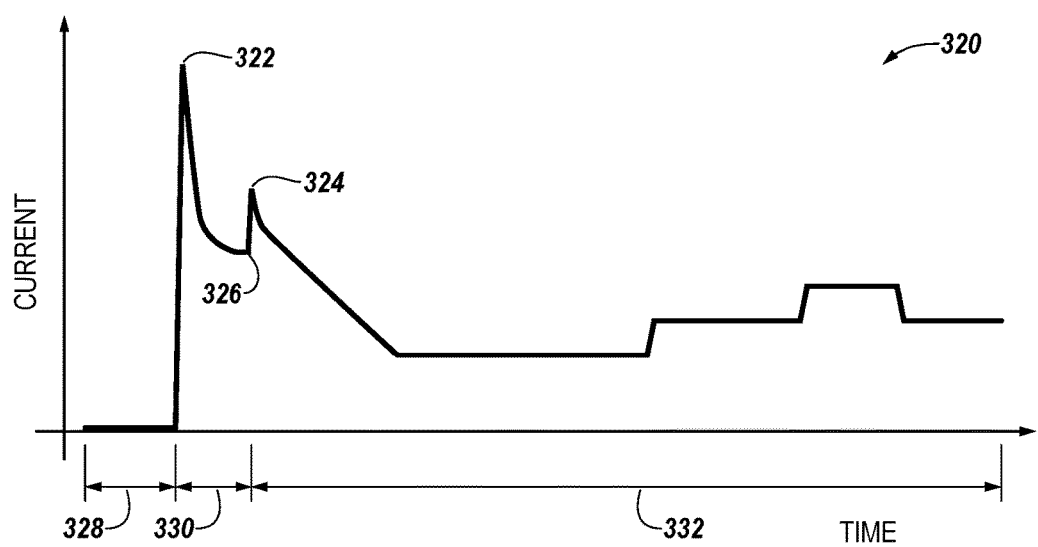
FIG. 3 illustrates a diagram associated with performing program operations in memory in accordance with a number of embodiments of the present disclosure.

FIG. 3 illustrates a diagram associated with performing program operations in memory in accordance with a number of embodiments of the present disclosure. In one or more embodiments, an r-set signal 320 includes a first portion 330 and a second portion 332. The first portion 330 can include a signal to program memory cells to a reset state. The second portion 332 can include a signal to program memory cells to a set state. An r-set signal 320 can include a selection-phase 328, a reset peak 322, a reset trough 326, and a set peak 324. In one or more embodiments, the selection-phase 328 can include an amount of time to prepare the first portion 330 of r-set signal 320. The time associated with preparing the second portion 332 of the r-set signal 320 can include the time of selection phase 328 and the time associated with applying the first portion 330 of the r-set signal 320. Therefore, the time associated with the selection phase 328 of the r-set signal 320 is based on the time to prepare the first portion 330 and not the second portion 332.

In one or more embodiments of the present disclosure, a first state is a set state and a second state is a reset state. A first portion 330 of r-set signal 320 can include programming from the first state to the second state. In one or more embodiments, the first portion 330 of r-set signal 320 can take approximately 15 nanoseconds (ns). A second portion 332 of r-set signal 320 can include programming from the second state to the first state. In one or more embodiments, the second portion 332 of r-set signal 320 can take approximately 500 nanoseconds (ns). R-set signal 320 can be a single, uninterrupted signal or multiple, interrupted signals.

In one or more embodiments of the present disclosure, an s-reset signal could be used during a program operation. In one or more embodiments, an s-reset signal can include a first portion to program memory cells to a set state and a second portion to program memory cells to a reset state. For example, the s-reset can include portion 332 from FIG. 3, which programs from the second state to the first state, followed by portion 330 from FIG. 3, which programs from the first state to the second state.

FIG. 4A is a table illustrating state and signal of a number of portions of a program operation 440 in accordance with a number of embodiments of the present disclosure. The state 442 illustrates the program state before the program operation and the program state after the program operation. The signal 444 illustrates the signal applied to a portion of memory cells of an array of memory cells to maintain or change the program state of the portion of memory cells. A first portion 446 of the program operation 440 applies an r-set signal to memory cells that remain in a first program state (e.g. a set state corresponding to a logic state of 1). The r-set signal may be applied to memory cells remaining in the set state during program operation 440 to counteract drift of set cells. Set-on-set degradation can occur in memory cells where set signals are applied to memory cells that were already programmed to a set state. Set-on-set degradation can occur when memory cells do not change states during program operations. An r-set signal can reduce set-on-set degradation for memory cells that are to remain in a set state after a program operation by programming memory cells to a reset state and then to a set state.

In one or more embodiments of the present disclosure, a second portion 448 of the program operation 440 applies a reset signal to memory cells that remain in a second program state (e.g. a reset state corresponding to a logic state of 0). A third portion 450 of the program operation 440 applies a reset signal to memory cells that change from the first program state to the second program state. A fourth portion 452 of the program operation 440 applies an r-set signal to memory cells that change from the second program state to the first program state.

In one or more embodiments of the present disclosure, the program operation can be performed blind. The program operation can be performed blind by applying a program signal to each memory cell of the array of memory cells.

FIG. 4B is a table illustrating state and signal of a number of portions of a program operation 454 in accordance with a number of embodiments of the present disclosure. The state 442 illustrates the program state before the program operation and the program state after the program operation. The signal 444 illustrates the signal applied to a portion of memory cells of an array of memory cells to maintain or change the program state of the portion of memory cells. A first portion 460 of the program operation 454 applies an r-set signal to memory cells that remain in a first program state (e.g. a set state corresponding to a logic state of 1). A second portion 462 of the program operation 454 applies a reset signal to memory cells that remain in a second program state (e.g. a reset state corresponding to a logic state of 0). A third portion 464 of the program operation 454 applies a reset signal to memory cells that change from the first program state to the second program state. A fourth portion 464 of the program operation 454 applies a set signal to memory cells that change from the second program state to the first program state.

In one or more embodiments of the present disclosure, a pre-read operation on memory cells of the array of memory cells can be performed before the program operation. The pre-read can determine which of the memory cells of the array of memory cells will be programmed during the program operation.

FIG. 4C is a table illustrating state and signal of a number of portions of a program operation 468 in accordance with a number of embodiments of the present disclosure. The state 442 illustrates the program state before the program operation and the program state after the program operation. The signal 444 illustrates the signal applied to a portion of memory cells of an array of memory cells to maintain or change the program state of the portion of memory cells. A first portion 474 of the program operation 468 applies an r-set signal to memory cells that remain in a first program state (e.g. a set state corresponding to a logic state of 1). A second portion 476 of the program operation 468 does not apply a signal to memory cells that remain in a second program state (e.g. a reset state corresponding to a logic state of 0). A third portion 478 of the program operation 468 applies a reset signal to memory cells that change from the first program state to the second program state. A fourth portion 480 of the program operation 468 applies a set signal to memory cells that change from the second program state to the first program state.

In one or more embodiments of the present disclosure, a pre-read operation on memory cells of the array of memory cells can be performed before the program operation. The pre-read can determine which of the memory cells of the array of memory cells will be programmed during the program operation.

FIG. 4D is a table illustrating state and signal of a number of portions of a program operation 482 in accordance with a number of embodiments of the present disclosure. The state 442 illustrates the program state before the program operation and the program state after the program operation. The signal 444 illustrates the signal applied to a portion of memory cells of an array of memory cells to maintain or change the program state of the portion of memory cells. A first portion 488 of the program operation 482 applies an r-set signal to memory cells that remain in a first program state (e.g. a set state corresponding to a logic state of 1). A second portion 490 of the program operation 482 applies an s-reset signal to memory cells that remain in a second program state (e.g. a reset state corresponding to a logic state of 0). The s-reset signal may be applied to memory cells remaining in the reset state during program operation 482 to counteract drift of reset cells. Reset-on-reset degradation can occur in memory cells where reset signals are applied to memory cells that were already programmed to a reset state. Reset-on-reset degradation can occur when memory cells do not change states during program operations. An s-reset can reduce reset-on-reset degradation for memory cells that are to remain in a reset state after a program operation by programming memory cells to a set state and then to a reset state.

In one or more embodiments of the present disclosure, a third portion 492 of the program operation 482 applies an s-reset signal to memory cells that change from the first program state to the second program state. A fourth portion 494 of the program operation 482 applies an r-set signal to memory cells that change from the second program state to the first program state.

In one or more embodiments of the present disclosure, the program operation can be performed blind. The program operation can be performed blind by applying a program signal to each memory cell of the array of memory cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   a controller configured to:
      perform a pre-read operation to determine which memory cells of the array of memory cells will be programmed during a program operation; and
      perform the program operation on the array of memory cells by applying a first program signal to a first portion of the array of memory cells that are to remain in a first state, wherein the first program signal programs memory cells to a second state and then to the first state, and wherein the first program signal includes a first portion applied during a first time period and a second portion applied during a second time period, wherein the second time period is different from the first time period.

2. The apparatus of claim 1, wherein the controller is configured to apply a second program signal to a second portion of the array of memory cells that are to change from the second state to the first state.

3. The apparatus of claim 1, wherein the controller is configured to apply a third program signal to a third portion of the array of memory cells that are to change from the first state to the second state.

4. The apparatus of claim 1, wherein the first portion includes a reset signal.

5. The apparatus of claim 1, wherein the second portion includes a set signal.

6. The apparatus of claim 1, wherein the controller is configured to avoid applying any program signal to a fourth portion of the array of memory cells that are to remain in the second state.

7. An apparatus, comprising:
   an array of memory cells; and
   a controller configured to:
      perform a pre-read operation to determine which memory cells of the array of memory cells will be programmed during a program operation; and
      perform the program operation on the array of memory cells by:
         applying a first program signal to a first portion of the array of memory cells that are to remain in a first state, wherein a first portion of the first program signal programs memory cells to a second state during a first time period and then a second portion of the first program signal programs the memory cells to the first state during a second time period, wherein the second time period is different from the first time period; and
         applying a second program signal to a second portion of the array of memory cells that are to change from the second state to the first state.

8. The apparatus of claim 7, wherein the controller is configured to apply a third program signal to a third portion of the array of memory cells that are to change from the first state to the second state.

9. The apparatus of claim 7, wherein the first state is a set state.

10. The apparatus of claim 7, wherein the second state is a reset state.

11. The apparatus of claim 7, wherein the first program signal includes a selection-phase.

12. The apparatus of claim 11, wherein the selection-phase includes an amount of time to prepare the first portion of the first program signal.

13. A method, comprising:
   performing a pre-read operation to determine which memory cells of an array of memory cells will be programmed during a program operation;
   performing the program operation on the array of memory cells by applying a first program signal to a first portion of the array of memory cells that are to remain in a first state, wherein a first portion of the first program signal programs memory cells to a second state during a first time period and then a second portion of the first program signal programs the memory cells to the first state during a second time period, wherein the second time period is different from the first time period.

14. The method of claim 13, wherein performing the program operation includes applying a second program signal to a second portion of the array of memory cells that are to change from the second state to the first state.

15. The method of claim 13, wherein performing the program operation includes applying a third program signal to a third portion of the array of memory cells that are to change from the first state to the second state.

16. The method of claim 13, wherein the first program signal includes a set and reset signal.

17. The method of claim 14, wherein the second program signal includes a set signal.

18. The method of claim 15, wherein the third program signal includes a reset signal.

19. The method of claim 16, wherein the first program signal is a single uninterrupted signal.

* * * * *